US012813206B2

(12) United States Patent
Maki

(10) Patent No.: US 12,813,206 B2
(45) Date of Patent: Nov. 24, 2026

(54) BONDING APPARATUS, BONDING SYSTEM, BONDING METHOD, AND RECORDING MEDIUM

(71) Applicant: Tokyo Electron Limited, Tokyo (JP)

(72) Inventor: Tetsuya Maki, Koshi City (JP)

(73) Assignee: TOKYO ELECTRON LIMITED, Tokyo (JP)

(*) Notice: Subject to any disclaimer, the term of this patent is extended or adjusted under 35 U.S.C. 154(b) by 712 days.

(21) Appl. No.: 18/295,462

(22) Filed: Apr. 4, 2023

(65) Prior Publication Data

US 2023/0326797 A1 Oct. 12, 2023

(30) Foreign Application Priority Data

Apr. 6, 2022 (JP) ................................ 2022-063277

(51) Int. Cl.

*H10P 72/00* (2026.01)
*H10D 84/03* (2025.01)
*H10D 88/00* (2026.01)
*H10P 10/00* (2026.01)
*H10P 72/50* (2026.01)

(52) U.S. Cl.

CPC ........ *H10P 72/0606* (2026.01); *H10P 10/128* (2026.01); *H10P 72/0428* (2026.01); *H10P 72/0438* (2026.01); *H10P 72/50* (2026.01); *H10D 84/038* (2025.01); *H10D 88/01* (2025.01)

(58) Field of Classification Search

CPC ....... H10P 10/12–1285; H10P 72/0606; H10P 72/50; H10P 72/0428; H10P 72/0438

See application file for complete search history.

(56) References Cited

U.S. PATENT DOCUMENTS

| | | | | |
|---|---|---|---|---|
| 2019/0273063 | A1 | 9/2019 | Nakamitsu et al. | |
| 2019/0312006 | A1 | 10/2019 | Nakamitsu et al. | |
| 2020/0004166 | A1* | 1/2020 | Aoki | G01B 11/00 |
| 2023/0207368 | A1* | 6/2023 | Mori | H10P 72/0446 156/64 |

FOREIGN PATENT DOCUMENTS

| | | | | |
|---|---|---|---|---|
| JP | 2013-122986 A | | 6/2013 | |
| JP | 2023077928 A | * | 6/2023 | H10P 72/0606 |
| WO | 2018/088091 A1 | | 5/2018 | |
| WO | 2018/088094 A1 | | 5/2018 | |

OTHER PUBLICATIONS

Translation of JP_2023077928_A (Year: 2023).*

* cited by examiner

Primary Examiner — Aaron J Gray

(74) *Attorney, Agent, or Firm* — Chrisman Gallo Tochtrop LLC

(57) ABSTRACT

A bonding apparatus configured to bond substrates to each other includes a first holder, a second holder, a moving unit, a housing, a scale member and a read head. The first holder attracts and holds a first substrate from above. The second holder attracts and holds a second substrate from below. The moving unit moves a first one of the first holder and the second holder with respect to a second one thereof in a first horizontal direction and a second horizontal direction orthogonal to the first horizontal direction. The housing accommodates therein the first holder, the second holder, and the moving unit. The scale member is disposed within the housing and has gradations indicating positions in the first and the second horizontal directions. The read head is moved as one body with the first one, and reads the gradations to measure the position of the first one.

12 Claims, 5 Drawing Sheets

BONDING APPARATUS, BONDING SYSTEM, BONDING METHOD, AND RECORDING MEDIUM

CROSS-REFERENCE TO RELATED APPLICATION

This application claims the benefit of Japanese Patent Application No. 2022-063277 filed on Apr. 6, 2022, the entire disclosure of which is incorporated herein by reference.

TECHNICAL FIELD

The various aspects and embodiments described herein pertain generally to a bonding apparatus, a bonding system, a bonding method, and a recording medium.

BACKGROUND

Conventionally, in order to meet the demand for high integration of semiconductor devices, it has been proposed to use a three-dimensional integration technique of stacking the semiconductor devices in three dimensions. As an example of a system using this three-dimensional integration technique, there is known a bonding technique of bonding substrates such as semiconductor wafers to each other.

Patent Document 1: International Publication No. 2018/088094

SUMMARY

In one exemplary embodiment, a bonding apparatus configured to bond substrates to each other includes a first holder, a second holder, a moving unit, a housing, a scale member and a read head. The first holder is configured to attract and hold a first substrate from above. The second holder is configured to attract and hold a second substrate from below. The moving unit is configured to move a first one of the first holder and the second holder with respect to a second one of the first holder and the second holder in a first horizontal direction and a second horizontal direction orthogonal to the first horizontal direction. The housing accommodates therein the first holder, the second holder, and the moving unit. The scale member is disposed within the housing and has gradations indicating positions in the first horizontal direction and the second horizontal direction. The read head is configured to be moved as one body with the first one of the first holder and the second holder, and configured to read the gradations of the scale member to measure the position of the first one of the first holder and the second holder.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
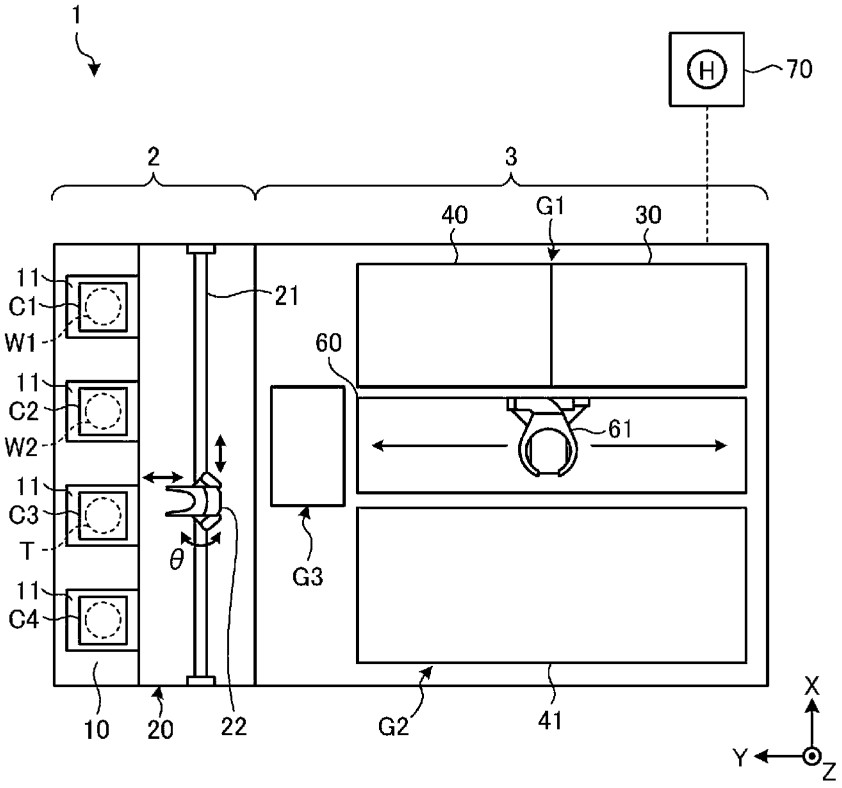
FIG. 1 is a schematic diagram illustrating a configuration of a bonding system according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, embodiments for a bonding apparatus, a bonding system, a bonding method, and a recording medium according to the present disclosure (hereinafter, referred to as "exemplary embodiments") will be described in detail with reference to the accompanying drawings. Further, it should be noted that the bonding apparatus, the bonding system, the bonding method and the recording medium according to the present disclosure are not limited by the exemplary embodiments. Further, unless processing contents are contradictory, the various exemplary embodiments can be appropriately combined. Furthermore, in the various exemplary embodiments to be described below, same parts will be assigned same reference numerals, and redundant description will be omitted.

Further, in the following exemplary embodiments, expressions such as "constant," "perpendicular," "vertical" and "parallel" may be used. These expressions, however, do not imply strictly "constant", "perpendicular," "vertical" and "parallel". That is, these expressions allow some tolerable errors in, for example, manufacturing accuracy, installation accuracy, or the like.

Moreover, in the various accompanying drawings, for the purpose of clear understanding, there may be used a rectangular coordinate system in which the X-axis direction, Y-axis direction and Z-axis direction which are orthogonal to one another are defined and the positive Z-axis direction is defined as a vertically upward direction. Further, a rotational direction around a vertical axis may be referred to as "θ direction."

In recent years, semiconductor devices are getting highly integrated. If a multiple number of highly integrated semiconductor devices are placed on a horizontal plane and these semiconductor devices are connected by wiring to be produced as a product, there is a concern that the length of the wiring may be increased, resulting in an increase of resistance of the wiring and an increase of a wiring delay.

In view of this, it has been proposed to use a three-dimensional integration technique of stacking semiconductor devices three-dimensionally. In this three-dimensional integration technique, two sheets of semiconductor wafers (hereinafter, referred to as "substrates") are bonded by using a bonding system described in Patent Document 1, for example.

In the bonding apparatus, one substrate (hereinafter, referred to as "first substrate") and the other substrate (hereinafter, referred to as "second substrate") are bonded together in the state that the first substrate is held by using a first holder and the second substrate is held by using a second holder that is disposed below the first holder. Before the substrates are bonded to each other in this way, the second holder is moved in a horizontal direction to adjust the positions of the first substrate and the second substrate in the horizontal direction, and the second holder is moved in a vertical direction to adjust the positions of the first substrate and the second substrate in the vertical direction.

In the bonding apparatus described in Patent Document 1 described above, when the second holder is moved in the horizontal direction, the position of the moving unit in the horizontal direction is measured by using a laser interferometer. By controlling the moving unit based on the measurement result, the position of the second holder in the horizontal direction is adjusted.

In the technique of bonding the substrates to each other as described above, there is a demand for improving bonding precision between the substrates. By way of example, the bonding precision can be improved by minimizing a positional deviation between the first substrate and the second substrate in the horizontal direction.

<Configuration of Bonding System>

Figure 2:
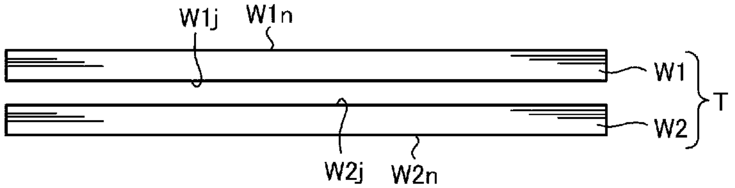
FIG. 2 is a schematic diagram illustrating a state of a first substrate and a second substrate before they are bonded according to the exemplary embodiment.

First, a configuration of a boding system according to an exemplary embodiment will be described with reference to FIG. 1 and FIG. 2. FIG. 1 is a schematic diagram illustrating the configuration of the bonding system according to the exemplary embodiment. FIG. 2 is a schematic diagram illustrating a state of a first substrate and a second substrate before they are bonded according to the exemplary embodiment.

A bonding system 1 shown in FIG. 1 is configured to form a combined substrate T by bonding a first substrate W1 and a second substrate W2 (see FIG. 2).

The first substrate W1 and the second substrate W2 are single crystalline silicon wafers, and a multiple number of electronic circuits are formed on their plate surfaces. The first substrate W1 and the second substrate W2 have the substantially same diameter. Alternatively, either one of the first substrate W1 and the second substrate W2 may be a substrate on which no electronic circuit is formed, for example.

In the following description, as shown in FIG. 2, among plate surfaces of the first substrate W1, a plate surface to be bonded to the second substrate W2 will be referred to as "bonding surface W1*j*", and a plate surface opposite to the bonding surface W1*j* will be referred to as "non-bonding surface W1*n*". Further, among plate surfaces of the second substrate W2, a plate surface to be bonded to the first substrate W1 will be referred to as "bonding surface W2*j*", and a plate surface opposite to the bonding surface W2*j* will be referred to as "non-bonding surface W2*n*".

As depicted in FIG. 1, the bonding system 1 includes a carry-in/out station 2 and a processing station 3. The carry-in/out station 2 is disposed on the positive Y-axis side of the processing station 3, and is connected as a single body with the processing station 3.

The carry-in/out station 2 includes a placing table 10 and a transfer section 20. The placing table 10 is equipped with a multiple number of placing plates 11. Respectively provided on the placing plates 11 are cassettes C1 to C4 each of which accommodates therein a plurality of (e.g., 25 sheets of) substrates horizontally. The cassette C1 accommodates therein a plurality of first substrates W1; the cassette C2, a plurality of second substrates W2; and the cassette C3, a plurality of combined substrates T. The cassette C4 is a cassette for collecting, for example, a defective substrate. Further, the number of the cassettes C1 to C4 placed on the placing plates 11 is not limited to the shown example.

The transfer section 20 is provided adjacent to the negative Y-axis side of the placing table 10. Provided in the transfer section 20 are a transfer path 21 extending in the X-axis direction and a transfer device 22 configured to be movable along the transfer path 21. The transfer device 22 is configured to be movable in the X-axis direction as well as in the Y-axis direction and pivotable around the Z-axis. The transfer device 22 transfers the first substrates W1, the second substrates W2, and the combined substrates T between the cassettes C1 to C4 placed on the placing plates 11 and a third processing block G3 of the processing station 3 to be described later.

The processing station 3 is provided with, for example, three processing blocks G1, G2 and G3. The first processing block G1 is disposed on the rear side (positive X-axis side of FIG. 1) of the processing station 3. Further, the second processing block G2 is provided on the front side (negative X-axis side of FIG. 1) of the processing station 3, and the third processing block G3 is disposed on the carry-in/out station 2 side (positive Y-axis side of FIG. 1) of the processing station 3.

Disposed in the first processing block G1 is a surface modifying apparatus 30 configured to modify the bonding surface W1*j* of the first substrate W1 and the bonding surface W2*j* of the second substrate W2. The surface modifying apparatus 30 cuts a $SiO_2$ bond on the bonding surfaces W1*j* and W2*j* of the first and second substrates W1 and W2 into a single bond of SiO, thus allowing the bonding surfaces W1*j* and W2*j* to be modified so that they are easily hydrophilized afterwards.

Specifically, in the surface modifying apparatus 30, an oxygen gas or a nitrogen gas as a processing gas is excited into plasma under, for example, a decompressed atmosphere to be ionized. As these oxygen ions or nitrogen ions are radiated to the bonding surfaces W1*j* and W2*j* of the first and second substrates W1 and W2, the bonding surfaces W1*j* and W2*j* are modified by being plasma-processed.

Further, in the first processing block G1, a surface hydrophilizing apparatus 40 is disposed. The surface hydrophilizing apparatus 40 is configured to hydrophilize and clean the bonding surfaces W1*j* and W2*j* of the first and second substrates W1 and W2 with, for example, pure water. To elaborate, the surface hydrophilizing apparatus 40 supplies the pure water onto the first substrate W1 or the second substrate W2 while rotating the first substrate W1 or the second substrate W2 held by, for example, a spin chuck. Accordingly, the pure water supplied onto the first substrate W1 or the second substrate W2 is diffused on the bonding surface W1*j* of the first substrate W1 or the bonding surface W2*j* of the second substrate W2, so that the bonding surfaces W1*j* and W2*j* are hydrophilized.

Here, although the surface modifying apparatus 30 and the surface hydrophilizing apparatus 40 are arranged side by side, the surface hydrophilizing apparatus 40 may be stacked on top of or under the surface modifying apparatus 30.

In the second processing block G2, a bonding apparatus 41 is disposed. The bonding apparatus 41 is configured to bond the hydrophilized first and second substrates W1 and W2 by an intermolecular force. A specific configuration of the bonding apparatus 41 will be described later.

A transfer section 60 is formed in a region surrounded by the first processing block G1, the second processing block G2, and the third processing block G3. A transfer device 61 is disposed in the transfer section 60. The transfer device 61 has a transfer arm configured to be movable in a vertical direction and a horizontal direction and pivotable around a vertical axis, for example. This transfer device 61 is moved within the transfer section 60 and transfers the first substrate W1, the second substrate W2 and the combined substrate T to preset devices within the first processing block G1, the second processing block G2, and the third processing block G3 which are adjacent to the transfer section 60.

Furthermore, the bonding system 1 is equipped with a control device 70. The control device 70 controls an operation of the bonding system 1. This control device 70 may be implemented by, for example, a computer, and includes a controller and a storage that are not illustrated here. The controller includes a microcomputer having a CPU (Central Processing Unit), a ROM (Read Only Memory), a RAM (Random Access Memory), an input/output port, and so forth as well as various kinds of circuits. The CPU of the microcomputer implements a control to be described later by reading out and executing a program stored in the ROM. Further, the storage may be implemented by, for example, a semiconductor memory device such as a RAM or a flash memory, or a storage device such as a hard disk or an optical disk.

Further, the program may be recorded on a computer-readable recording medium and installed from the recording medium to the storage of the control device 70. The computer-readable recording medium may be, by way of non-limiting example, a hard disk HD, a flexible disk FD, a compact disk CD, a magnetic optical disk MO, a memory card, or the like.

<Configuration of Bonding Apparatus>

Figure 3:
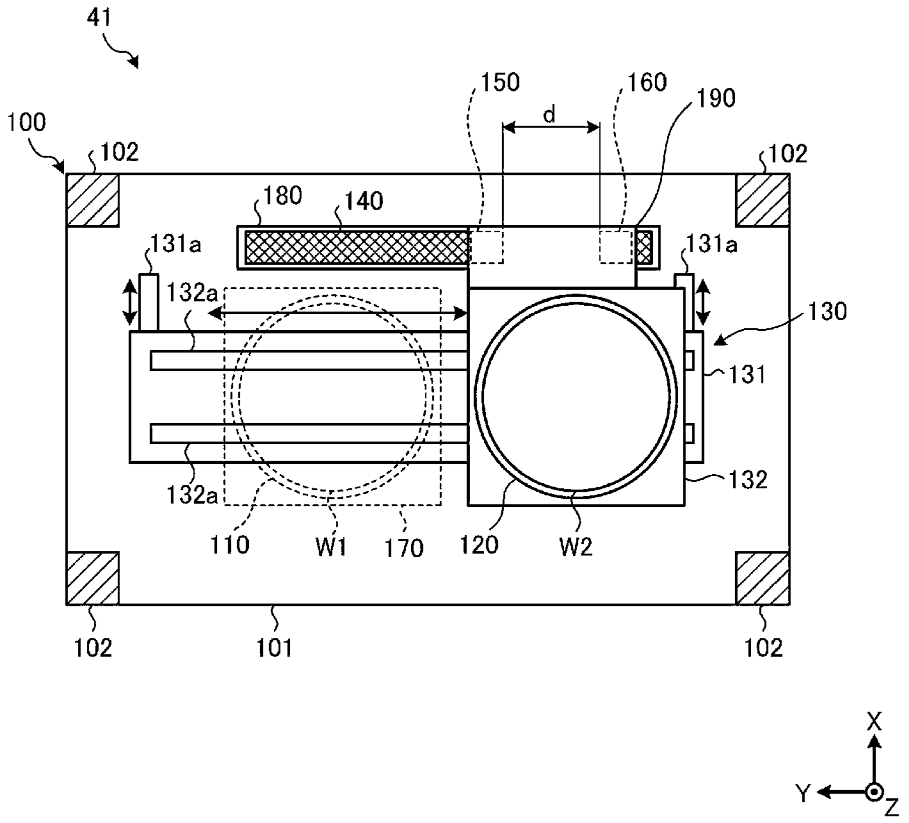
FIG. 3 is a plan view of a bonding apparatus according to the exemplary embodiment.
Figure 4:
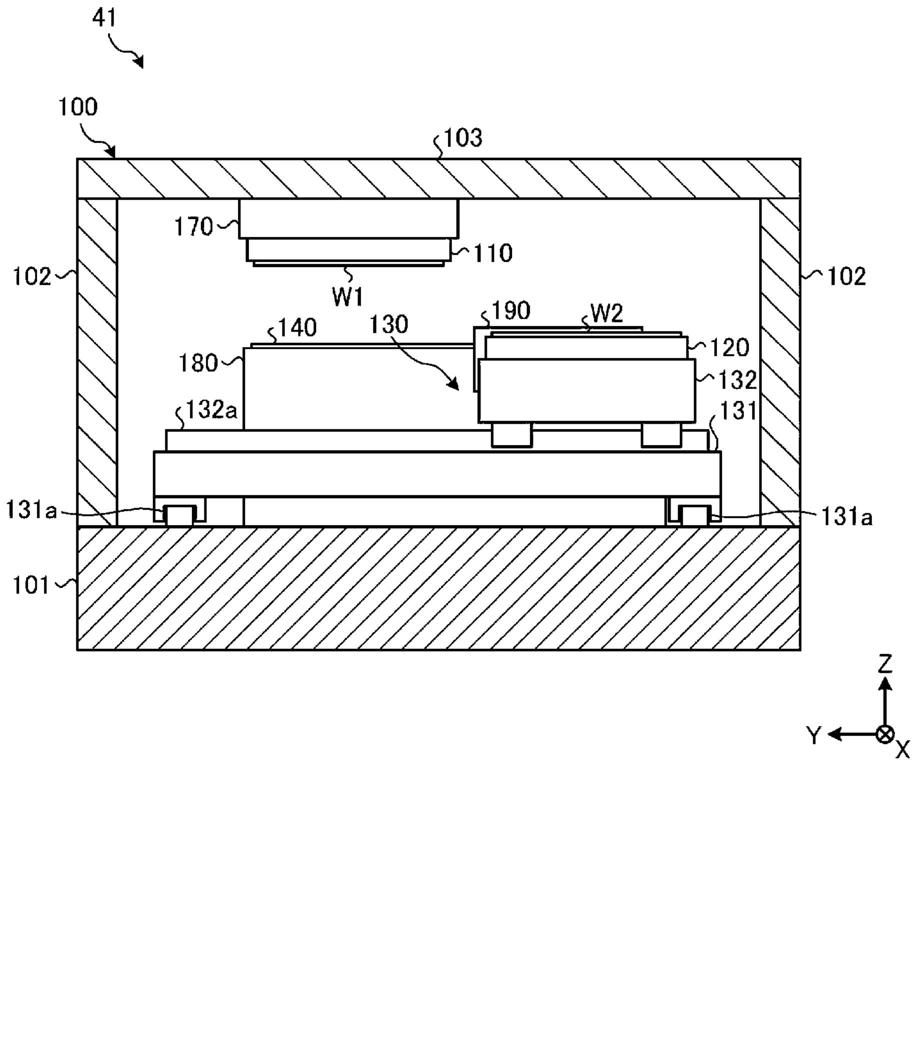
FIG. 4 is a side view of the bonding apparatus according to the exemplary embodiment.

Here, the configuration example of the bonding apparatus 41 will be explained with reference to FIG. 3 and FIG. 4. FIG. 3 is a plan view of the bonding apparatus 41 according to the exemplary embodiment. FIG. 4 is a side view of the bonding apparatus 41 according to the exemplary embodiment.

As depicted in FIG. 3 and FIG. 4, the bonding apparatus 41 according to the exemplary embodiment includes a housing 100, a first holder 110, a second holder 120, a moving unit 130, a scale member 140, a first read head 150, and a second read head 160.

The housing 100 is, for example, a box body having a rectangular shape with an open side when viewed from the top, and it accommodates therein the first holder 110, the second holder 120, the moving unit 130, the scale member 140, the first read head 150, and the second read head 160.

The housing 100 is equipped with, for example, a placing table 101, a plurality of supporting columns 102 standing upright on a top surface of the placing table 101, and a ceiling member 103 supported by the plurality of supporting columns 102. The top surface of the placing table 101 becomes a bottom surface of the housing 100, and a bottom surface of the ceiling member 103 becomes a ceiling surface of the housing 100.

The first holder 110 is configured to attract and hold a top surface (non-bonding surface W1*n*) of the first substrate W1 from above. A bottom surface of the first holder 110 serves as a substrate holding surface configured to hold the first substrate W1 thereon. The first holder 110 is supported by an elevating unit 170 provided at the ceiling member 103 (see FIG. 4). The elevating unit 170 is configured to move the first holder 110 along a vertical direction (Z-axis direction). In this way, the elevating unit 170 is capable of bringing the first holder 110 closer to the second holder 120.

The second holder 120 is provided below the first holder 110, and is configured to attract and hold a bottom surface (non-bonding surface W2*n*) of the second substrate W2 from below. A top surface of the second holder 120 serves as a substrate holding surface configured to hold the second substrate W2 thereon.

Figure 5:
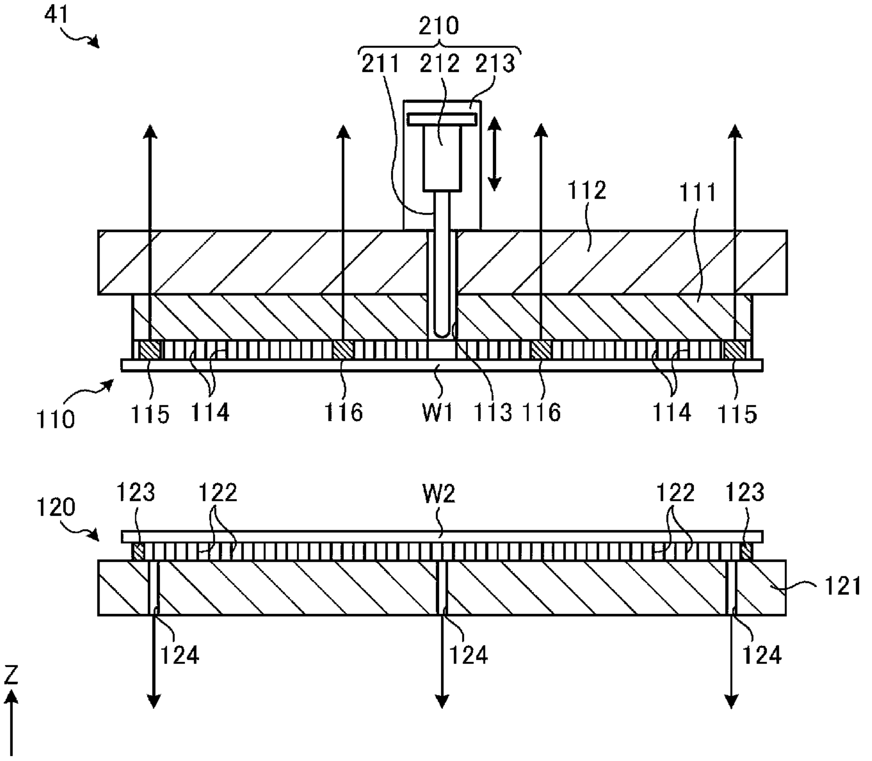
FIG. 5 is a side view of a first holder and a second holder according to the exemplary embodiment.

Here, a configuration example of the first holder 110 and the second holder 120 will be described with reference to FIG. 5. FIG. 5 is a side view of the first holder 110 and the second holder 120 according to the exemplary embodiment.

As depicted in FIG. 5, the first holder 110 has a main body 111. The main body 111 is supported by a supporting member 112. A through hole 113 is formed through the supporting member 112 and the main body 111 in a vertical direction. The position of the through hole 113 corresponds to a central portion of the first substrate W1 attracted to and held by the first holder 110. A push pin 211 of a striker 210 to be described later is inserted through this through hole 113.

The striker 210 is disposed on a top surface of the supporting member 112, and is equipped with the push pin 211, an actuator unit 212, and a linearly moving mechanism 213. The push pin 211 is a columnar member extending along the vertical direction, and is supported by the actuator unit 212.

The actuator unit 212 generates a regular pressure in a certain direction (here, a vertically downward direction) by air supplied from, for example, an electro-pneumatic regulator (not shown). By the air supplied from the electro-pneumatic regulator, the actuator unit 212 is capable of controlling a press load applied to the central portion of the first substrate W1 when it is brought into contact with the central portion of the first substrate W1. Further, a leading end of the push pin 211 is movable up and down in the vertical direction through the through hole 113 by the air from the electro-pneumatic regulator.

The actuator unit 212 is supported by the linearly moving mechanism 213. The linearly moving mechanism 213 moves the actuator unit 212 along the vertical direction by a driving unit having therein a motor, for example.

The striker 210 controls a movement of the actuator unit 212 by the linearly moving mechanism 213, and controls the press load on the first substrate W1 from the push pin 211 by the actuator unit 212. In this way, the striker 210 presses the central portion of the first substrate W1 attracted to and held by the first holder 110 into contact with the second substrate W2.

A plurality of pins 114 is provided on a bottom surface of the main body 111, and these pins 114 come into contact with the top surface (non-bonding surface) of the first substrate W1. Each pin 114 has a diameter of, e.g., 0.1 mm to 1 mm and a height of, e.g., several tens of micrometers (μm) to several hundreds of micrometers (μm). The plurality of pins 114 are uniformly arranged at a distance of, e.g., 2 mm therebetween.

The first holder 110 is equipped with a plurality of attraction portions for attracting the first substrate W1 in a part of the regions where the plurality of pins 114 are provided. Specifically, a plurality of outer attraction portions 115 and a plurality of inner attraction portions 116 for attracting the first substrate W1 by evacuation are provided in a bottom surface of the main body 111 of the first holder 110. Each of the plurality of outer attraction portions 115 and the plurality of inner attraction portions 116 has an arc-shaped attraction region when viewed from the top. The outer attraction portions 115 and the inner attraction portions 116 have the same height as the pins 114.

The plurality of outer attraction portions 115 are provided at a peripheral portion of the main body 111. The plurality of outer attraction portions 115 are connected to a non-illustrated suction device such as a vacuum pump to attract and hold a peripheral portion of the first substrate W1 by evacuation.

The inner attraction portions 116 are arranged along a circumferential direction of the main body 111 at an inner side than the plurality outer attraction portions 115 in a diametrical direction of the main body 111. The plurality of inner attraction portions 116 are connected to a non-illustrated suction device such as a vacuum pump to attract a region between the peripheral portion and the central portion of the first substrate W1 by evacuation.

The second holder 120 will be explained. The second holder 120 has a main body 121 having a diameter equal to or larger than the diameter of the second substrate W2. Here, the second holder 120 having a diameter larger than that of the second substrate W2 is shown. A top surface of the main body 121 is a facing surface facing the bottom surface (non-bonding surface W2*n*) of the second substrate W2.

A plurality of pins 122 is provided on the top surface of the main body 121, and these pins 122 come into contact with the bottom surface (non-bonding surface W2*n*) of the second substrate W2. Each pin 122 has a diameter of, e.g., 0.1 mm to 1 mm and a height of, e.g., several tens of micrometers (μm) to several hundreds of micrometers (μm). These pins 122 are uniformly arranged at a distance of, e.g., 2 mm therebetween.

Moreover, a lower rib 123 is provided in an annular shape on the top surface of the main body 121 to be located outside the plurality of pins 122. The lower rib 123 is formed in the annular shape and supports the peripheral portion of the second substrate W2 over the entire circumference thereof.

Further, the main body 121 has a plurality of lower suction openings 124. The plurality of lower suction openings 124 are provided in an attraction region surrounded by the lower rib 123. These lower suction openings 124 are connected to a non-illustrated suction device such as a vacuum pump via a non-illustrated suction line.

The second holder 120 decompresses the attraction region surrounded by the lower rib 123 by evacuating the attraction region through the plurality of lower suction openings 124. Accordingly, the second substrate W2 disposed in the attraction region is attracted to and held by the second holder 120.

Since the lower rib 123 supports the peripheral portion of the bottom surface of the second substrate W2 over the entire circumference thereof, the second substrate W2 is properly suctioned up to the peripheral portion thereof. Accordingly, the entire surface of the second substrate W2 can be attracted and held. Further, since the bottom surface of the second substrate W2 is supported by the plurality of pins 122, the second substrate W2 may be easily separated from the second holder 120 when the suctioning of the second substrate W2 is released.

This bonding apparatus 41 attracts and holds the first substrate W1 with the first holder 110, and attracts and holds the second substrate W2 with the second holder 120. Then, the bonding apparatus 41 releases the attracting and holding of the first substrate W1 by the inner attraction portions 116, and lowers the push pin 211 of the striker 210 to press the central portion of the first substrate W1. As a result, the combined substrate T in which the first substrate W1 and the second substrate W2 are bonded to each other is obtained. The combined substrate T is carried out from the bonding apparatus 41 by the transfer device 61.

Referring back to FIG. 3 and FIG. 4, a configuration of the moving unit 130 will be described. The moving unit 130 moves the second holder 120 in the horizontal direction. Specifically, the moving unit 130 includes a first moving unit 131 configured to move the second holder 120 along the X-axis direction (an example of a first horizontal direction), and a second moving unit 132 configured to move the second holder 120 along the Y-axis direction (an example of a second horizontal direction).

The first moving unit 131 is mounted to a pair of first rails 131*a* extending in the X-axis direction, and is configured to be movable along the pair of first rails 131*a*. The pair of first rails 131*a* are provided on the bottom surface of the housing 100 (that is, the top surface of the placing table 101). Two opposite ends of the first moving unit 131 in the Y-axis direction can be independently moved along the pair of first rails 131*a* respectively by a driving device such as a linear motor.

The second moving unit 132 is mounted to a pair of second rails 132*a* extending in the Y-axis direction, and is configured to be movable along the pair of second rails 132*a*. The pair of second rails 132*a* are provided on a top surface of the first moving unit 131.

The second holder 120 is mounted to the second moving unit 132, and is moved as one body with the second moving unit 132. Moreover, as stated above, the second moving unit 132 is mounted to the first moving unit 131 with the pair of second rails 132*a* therebetween. With this configuration, the moving unit 130 is capable of moving the second holder 120 along the X-axis direction by moving the first moving unit 131, and capable of moving the second holder 120 in the Y-axis direction by moving the second moving unit 132. Here, a stroke (moving amount) of the first moving unit 131 along the X-axis direction is smaller than a stroke (moving amount) of the second moving unit 132 along the Y-axis direction. For example, the stroke (moving amount) of the first moving unit 131 along the X-axis direction may be less than the radius of the second substrate W2, and the stroke (moving amount) of the second moving unit 132 along the Y-axis direction may be equal to or larger than the diameter of the second substrate W2. Accordingly, since the size of the moving unit 130 along the X-axis direction is reduced, downsizing of the bonding apparatus 41 is achieved.

In addition, the second moving unit 132 includes a rotating unit (not shown) configured to rotate the second holder 120 around a vertical axis.

In this way, by moving the second holder 120 in the X-axis, the Y-axis and the 0 directions, the moving unit 130 performs position alignment between the first substrate W1 held by the first holder 110 and the second substrate W2 held by the second holder 120 in the horizontal direction.

Further, the moving unit 130 only needs to be able to move the first holder 110 and the second holder 120 relative to each other in the X-axis, the Y-axis and the θ directions. By way of example, the moving unit 130 may move the first holder 110 in the X-axis direction, the Y-axis direction, and the θ direction. Alternatively, the moving unit 130 may move the second holder 120 in the X-axis direction and the Y-axis direction while moving the first holder 110 in the θ direction. Still alternatively, the moving unit 130 may move the second holder 120 in the X-axis and the Y-axis direction while moving the first holder 110 and the second holder 120 in the θ direction.

The scale member 140 is disposed within the housing 100, and has gradations indicating positions in the X-axis direction and the Y-axis direction.

The first read head 150 and the second read head 160 are moved as one body with the second holder 120, and read the gradations of the scale member 140 to measure the position of the second holder 120.

However, in the position measurement using the laser interferometer as in the prior art, there is a risk that an error may occur due to the change in the temperature or the atmospheric pressure of the environment where the measurement is performed. That is, if the temperature or the atmospheric pressure of the measurement environment changes, the refractive index of the air changes, causing the wavelength of the laser light as the reference to change all the time. As a result, the measurement result obtained by the laser interferometer always has a varying error.

Meanwhile, in position measurement using a linear scale in which gradations of a scale member are read by a reader, the influence from the change in the temperature or the atmospheric pressure of the measurement environment between the scale member and the reader may be suppressed as the scale member and the reader are positioned close to each other. Therefore, it is possible to suppress the occurrence of the error in the measurement result obtained by the reader.

Therefore, in the bonding apparatus 41 according to the exemplary embodiment, the gradations of the scale member 140 are read by the first read head 150 and the second read head 160 that are moved as one body with the second holder 120, to thereby measure the position of the second holder 120.

The first read head 150 and the second read head 160 are close to the scale member 140 at a distance at which the gradations of the scale member 140 can be read. Since the first and second read heads 150 and 160 are positioned close to the scale member 140, the reading of the gradations by the first read head 150 and the second read head 160 is less likely to be affected by the change in the temperature or the atmospheric pressure. Therefore, the occurrence of the error in the measurement results of the first read head 150 and the second read head 160 that might be caused by the change in the temperature or the atmospheric pressure can be suppressed.

As the error in the measurement results of the first read head 150 and the second read head 160 is reduced, positioning precision of the second substrate W2 is improved. Therefore, according to the bonding apparatus 41 of the exemplary embodiment, bonding precision between the first substrate W1 and the second substrate W2 can be improved.

Figure 6:
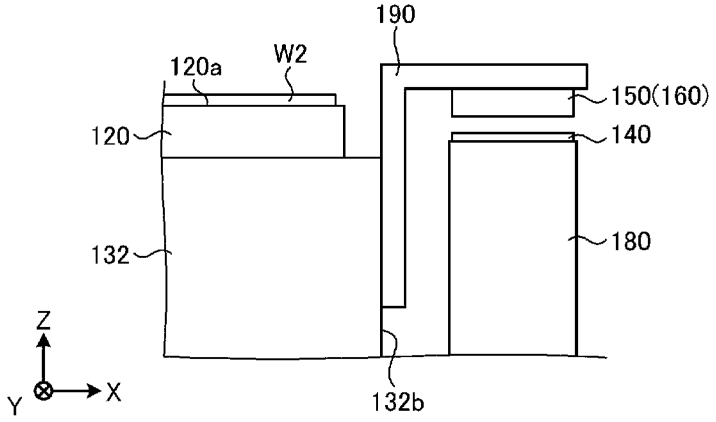
FIG. 6 is a diagram showing a configuration and a positional relationship of a scale member, a first read head, and a second read head according to the exemplary embodiment.

Here, a configuration and a positional relationship of the scale member 140, the first read head 150, and the second read head 160 will be described with reference to FIG. 3, FIG. 4, and FIG. 6. FIG. 6 is a diagram showing the configuration and the positional relationship of the scale member 140, the first read head 150, and the second read head 160 according to the exemplary embodiment. FIG. 6 illustrates the scale member 140, the first read head 150, and the second read head 160 seen from the negative Y-axis direction.

As depicted in FIG. 4 and FIG. 6, the scale member 140 is disposed at a position closer to the substrate holding surface 120*a* of the second holder 120 than to the bottom surface of the housing 100 (that is, the top surface of the placing table 101) along the vertical direction (Z-axis direction). Specifically, by being fixed on an extension member 180 provided on the top surface of the placing table 101, the scale member 140 is disposed at the position closer to the substrate holding surface 120*a* of the second holder 120 than to the top surface of the placing table 101. For example, by being fixed on the extension member 180, the scale member 140 is positioned on a level with the substrate holding surface 120*a* of the second holder 120, or positioned lower than the substrate holding surface 120*a* of the second holder 120 and higher than a bottom surface of the second holder 120.

In this way, by locating the scale member 140 close to the height position of the substrate holding surface 120*a*, the first read head 150 and the second read head 160 are capable of reading the gradations of the scale member 140 at a height position as close to the substrate holding surface 120*a* as possible. Thus, as compared to the case where the scale member 140 is disposed away from the substrate holding surface 120*a*, the error in the measurement results of the first read head 150 and the second read head 160 is reduced.

Furthermore, a member for fixing the position of the scale member 140 is not limited to the extension member 180 as long as the scale member 140 can be disposed at the position closer to the substrate holding surface 120*a* of the second holder 120 than to the top surface of the placing table 101. By way of example, by being supported by a supporting member provided on a bottom surface of the ceiling member 103, the scale member 140 may be placed at the position closer to the substrate holding surface 120*a* of the second holder 120 than to the top surface of the placing table 101.

In addition, as shown in FIG. 3, the scale member 140 has a rectangular shape in which the length of the side along the X-axis direction is shorter than the length of the side along the Y-axis direction, when viewed from the top. Thus, since the size of the scale member 140 along the X-axis direction is reduced, the bonding apparatus 41 is scaled down.

The first read head 150 and the second read head 160 are mounted to a mounting member 190 provided at the second moving unit 132, so they are moved as one body with the second moving unit 132 and the mounting member 190.

As shown in FIG. 6, the mounting member 190 is, for example, an inverted L-shaped frame body when viewed from the side, and is provided at a side surface 132*b* located on the positive X-axis side of the second moving unit 132. The mounting member 190 is bent and extended in the positive X-axis direction. The first read head 150 and the second read head 160 are mounted on a bottom surface of the extension portion of the mounting member 190 so as to face the scale member 140.

As shown in FIG. 3, the first read head 150 and the second read head 160 are fastened to the mounting member 190 at a distance d therebetween along the Y-axis direction. The distance d is equal to or less than the diameter of the second substrate W2.

Here, when a difference arises in the moving amounts of the two opposite ends of the first moving unit 131 in the Y-axis direction, the second moving unit 132 is rotated in the θ direction on a horizontal plane (XY plane), and, along with this rotation of the second moving unit 132, the second holder 120 is unintentionally rotated in the θ direction on the horizontal plane (XY plane). Since the first read head 150 and the second read head 160 are provided to the mounting member 190 at the distance d therebetween, a rotation amount of the second holder 120 on the horizontal plane (XY plane) can be measured as a difference between measurement results regarding the X-axis direction.

The moving amounts of the two opposite ends of the first moving unit 131 in the Y-axis direction are adjusted by using the measurement results of the first read head 150 and the second read head 160 regarding the X-axis direction. Specifically, the first read head 150 and the second read head 160 respectively output the measurement results regarding the X-axis direction to the controller of the control device 70. Then, the controller of the control device 70 controls the first moving unit 131 to adjust the moving amounts of the two opposite ends in the Y-axis direction such that the measurement results of the first read head 150 and the second read head 160 regarding the X-axis direction become identical. This makes it possible to eliminate the difference between the moving amounts of the two opposite ends of the first moving unit 131 in the Y-axis direction, and, as a result, the unintentional rotation of the second holder 120 on the horizontal plane (XY plane) can be suppressed.

In addition, although not illustrated here, the bonding apparatus 41 is further equipped with a transition, a position adjusting mechanism, an inverting mechanism, and so forth. In the transition, the first substrate W1, the second substrate W2 and the combined substrate T are temporarily disposed. The position adjusting mechanism adjusts the directions of the first substrate W1 and the second substrate W2 in the horizontal direction. The inverting mechanism inverts the front and rear surfaces of the first substrate W1.

<Specific Operation of Bonding System>

Figure 7:
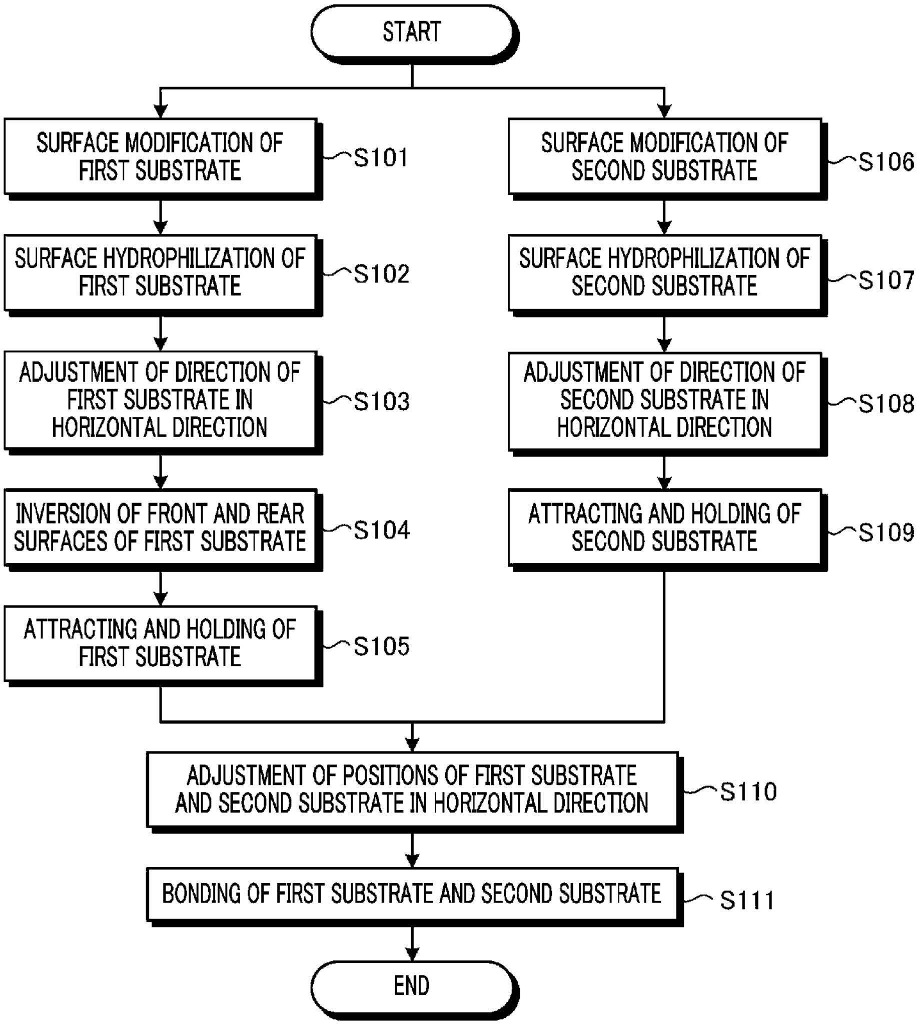
FIG. 7 is a flowchart illustrating a sequence of processings performed by the bonding system according to the exemplary embodiment.

Now, a specific operation of the bonding system 1 according to the exemplary embodiment will be discussed with reference to FIG. 7. FIG. 7 is a flowchart illustrating a sequence of a processing performed by the bonding system 1 according to the exemplary embodiment. The various processes shown in FIG. 7 are performed under the control of the control device 70.

First, the cassette C1 accommodating the plurality of first substrates W1, the cassette C2 accommodating the plurality of second substrates W2, and the empty cassette C3 are placed on the preset placing plates 11 of the carry-in/out station 2. Then, the first substrate W1 is taken out from the cassette C1 by the transfer device 22, and transferred into a transition device disposed within the third processing block G3.

Then, the first substrate W1 is transferred to the surface modifying apparatus 30 of the first processing block G1 by the transfer device 61. In the surface modifying apparatus 30, an oxygen gas as a processing gas is excited into plasma to be ionized under a preset decompressed atmosphere. Oxygen ions are radiated to the bonding surface of the first substrate W1, so that the bonding surface is plasma-processed. As a result, the bonding surface of the first substrate W1 is modified (process S101).

Subsequently, the first substrate W1 is transferred to the surface hydrophilizing apparatus 40 of the first processing block G1 by the transfer device 61. In the surface hydrophilizing apparatus 40, pure water is supplied onto the first substrate W1 while rotating the first substrate W1 held by the spin chuck. As a result, the bonding surface of the first substrate W1 is hydrophilized. Further, the bonding surface of the first substrate W1 is cleaned by this pure water (process S102).

Next, the first substrate W1 is transferred to the bonding apparatus 41 of the second processing block G2 by the transfer device 61. The first substrate W1 carried into the bonding apparatus 41 is then transferred into the position adjusting mechanism via the transition, and the direction of the first substrate W1 in the horizontal direction is adjusted by the position adjusting mechanism (process S103).

Thereafter, the first substrate W1 is delivered to the inverting mechanism from the position adjusting mechanism, and the front surface and the rear surface of the first substrate W1 are inverted by the inverting mechanism (process S104). To elaborate, the bonding surface W1*j* of the first substrate W1 is turned to face down. Then, the first substrate W1 is delivered to the first holder 110 from the inverting mechanism, and attracted to and held by the first holder 110 (process S105).

In parallel with the processing of the processes S101 to S105 upon the first substrate W1, a processing of the second substrate W2 is performed. First, the second substrate W2 is taken out of the cassette C2 by the transfer device 22, and transferred to the transition device disposed in the third processing block G3.

Then, the second substrate W2 is transferred to the surface modifying apparatus 30 by the transfer device 61, and the bonding surface W2*j* of the second substrate W2 is modified (process S106). Thereafter, the second substrate W2 is transferred to the surface hydrophilizing apparatus 40 by the transfer device 61, and the bonding surface W2*j* of the second substrate W2 is hydrophilized and cleaned (process S107).

Subsequently, the second substrate W2 is transferred to the bonding apparatus 41 by the transfer device 61. The second substrate W2 carried into the bonding apparatus 41 is transferred to the position adjusting mechanism via the transition. Then, the direction of the second substrate W2 in the horizontal direction is adjusted by the position adjusting mechanism (process S108).

Afterwards, the second substrate W2 is transferred to the second holder 120 and attracted to and held by the second holder 120 with a notch thereof directed toward a predetermined direction (process S109).

Next, the position adjustment between the first substrate W1 held by the first holder 110 and the second substrate W2 held by the second holder 120 in the horizontal direction is performed (process S110).

Specifically, a center position (X coordinate and Y coordinate) of the second substrate W2 is specified based on the measurement results of the first read head 150 and the second read head 160. Then, the second substrate W2 is moved by using the first moving unit 131 and the second moving unit 132 so that the center position of the second substrate W2 coincides with a center position of the first substrate W1.

Subsequently, the first substrate W1 and the second substrate W2 are bonded (process S111).

First, the positions of the first substrate W1 held by the first holder 110 and the second substrate W2 held by the second holder 120 in the vertical direction are adjusted. Specifically, the first holder 110 is lowered by using the elevating unit 170, thus allowing the second substrate W2 to be brought closer to the first substrate W1.

Next, after releasing the attracting and holding of the first substrate W1 by the plurality of inner attraction portions 116, the push pin 211 of the striker 210 is lowered to press down the central portion of the first substrate W1.

If the central portion of the first substrate W1 comes into contact with the central portion of the second substrate W2 and the central portions of the first and second substrates W1 and W2 are pressed by the striker 210 with a preset force, bonding is started between the pressed central portions of the first and second substrates W1 and W2. That is, since the bonding surface W1*j* of the first substrate W1 and the bonding surface W2*j* of the second substrate W2 are modified, a van der Waals force (intermolecular force) is first generated between the bonding surfaces W1*j* and W2*j*, so that the bonding surfaces W1*j* and W2*j* are bonded to each other. Furthermore, since the bonding surface W1*j* of the first substrate W1 and the bonding surface W2*j* of the second substrate W2 are hydrophilized, hydrophilic groups between the bonding surfaces W1*j* and W2*j* are hydrogen-bonded, so that the bonding surfaces W1*j* and W2*j* are strongly bonded. In this way, a bonding region is formed.

Thereafter, a bonding wave whereby the bonding region gets expanded from the central portions of the first and second substrates W1 and W2 toward the peripheral portions thereof occurs between the first substrate W1 and the second substrate W2. Afterwards, the attracting and holding of the first substrate W1 by the plurality of outer attraction portions 115 is released. Accordingly, the peripheral portion of the first substrate W1 attracted to and held by the outer attraction portions 115 falls down. As a result, the entire bonding surface W1*j* of the first substrate W1 and the entire bonding surface W2*j* of the second substrate W2 come into contact with each other to thereby form the combined substrate T.

Then, the push pin 211 is raised up to the first holder 110, and the attracting and holding of the second substrate W2 by the second holder 120 is released. Thereafter, the combined substrate T is carried out from the bonding apparatus 41 by the transfer device 61. In this way, the bonding processing including the series of processes is completed.

<Others>

The above exemplary embodiment has been described for the example where the bonding apparatus 41 is equipped with the two read heads (the first read head 150 and the second read head 160). Without being limited thereto, however, the number of the read heads may be one or more than two.

As stated above, a bonding apparatus (as an example, the bonding apparatus 41), as a bonding apparatus configured to bond substrates to each other, includes a first holder (as an example, the first holder 110), a second holder (for example, the second holder 120), a moving unit (as an example, the moving unit 130), a housing (as an example, the housing 100), a scale member (as an example, the scale member 140), and a read head (as an example, the first read head 150 and the second read head 160). The first holder attracts and holds a first substrate (as an example, the first substrate W1) from above. The second holder attracts and holds a second substrate (as an example, the second substrate W2) from below. The moving unit moves a first one of the first holder and the second holder with respect to a second one of the first holder and the second holder in a first horizontal direction (as an example, the X-axis direction) and a second horizontal direction (as an example, the Y-axis direction) orthogonal to the first horizontal direction. The housing accommodates therein the first holder, the second holder, and the moving unit. The scale member is disposed inside the housing, and has gradations indicating positions in the first horizontal direction and the second horizontal direction. The read head is moved as one body with the first one of the first holder and the second holder, and reads the gradations of the scale member to measure the position of the first one of the first holder and the second holder. Therefore, according to the bonding apparatus of the exemplary embodiment, in a bonding technique of bonding the substrates to each other, bonding precision between the substrates can be improved.

The moving unit may include a first moving unit configured to move the first one of the first holder and the second holder along the first horizontal direction, and a second moving unit configured to move the first one of the first holder and the second holder along the second horizontal direction. A stroke of the first moving unit along the first horizontal direction may be smaller than a stroke of the second moving unit along the second horizontal direction. Therefore, scale-down of the bonding apparatus is achieved.

The first moving unit may be fastened to a pair of rails extending along the first horizontal direction and may be moved along the pair of rails, and two opposite ends of the first moving unit in the second horizontal direction may be independently moved along the pair of rails, respectively. Thus, moving amounts of the two opposite ends of the first moving unit in the second horizontal direction can be adjusted independently.

The bonding apparatus according to the exemplary embodiment may include multiple read heads (as an example, the first read head 150 and the second read head 160). The second moving unit may be disposed above the first moving unit. The first one of the first holder and the second holder may be fastened to the second moving unit and moved as one body with the second moving unit. The multiple read heads may be fastened to a mounting member (as an example, the mounting member 190), which is provided at the second moving unit, at a distance (as an example, the distance d) therebetween in the second horizontal direction. Thus, the multiple read heads are capable of measuring a rotation amount of the second holder on a horizontal plane as a difference between measurement results in the first horizontal direction.

The distance may be equal to or less than a diameter of the second substrate.

The bonding apparatus according to the exemplary embodiment may further include a controller (as an example, the controller of the control device 70) configured to control the first moving unit to adjust the moving amounts of the two opposite ends such that the measurement results of the multiple read heads regarding the first horizontal direction are identical. Therefore, an unintentional rotation of the second holder on the horizontal plane can be suppressed.

The scale member may be disposed at a position closer to a substrate holding surface (as an example, the substrate holding surface 120*a*) of the first one of the first holder and the second holder than to a bottom surface of the housing along a vertical direction (as an example, the Z-axis direction). This configuration reduces an error in the measurement results of the read heads, as compared to a case where the scale member is disposed apart from the substrate holding surface.

The scale member may have a rectangular shape in which a length of a side along the first horizontal direction is shorter than a length of a side along the second horizontal direction, when viewed from a top. Thus, downsizing of the bonding apparatus is achieved.

The moving unit may also include a rotating unit configured to rotate at least one of the first holder or the second holder around a vertical axis. With this configuration, the first holder and the second holder can be moved relatively in the θ direction.

The bonding apparatus according to the exemplary embodiment may further include an elevating unit configured to bring the second one of the first holder and the second holder closer to the first one of the first holder and the second holder. With this configuration, the positions of the first substrate held by the first holder and the second substrate held by the second holder in a vertical direction can be adjusted.

It should be noted that the above-described exemplary embodiment is illustrative in all aspects and is not anyway limiting. The above-described exemplary embodiment may be omitted, replaced and modified in various ways without departing from the scope and the spirit of claims.

According to the exemplary embodiment, it is possible to improve the bonding precision between the substrates in the bonding technique of bonding the substrates to each other.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

I claim:

1. A bonding apparatus configured to bond substrates to each other, comprising:

a first holder configured to attract and hold a first substrate from above;

a second holder configured to attract and hold a second substrate from below;

a moving unit configured to move a first one of the first holder and the second holder with respect to a second one of the first holder and the second holder in a first horizontal direction and a second horizontal direction orthogonal to the first horizontal direction;

a housing accommodating therein the first holder, the second holder, and the moving unit;

a scale member, disposed within the housing, having gradations indicating positions in the first horizontal direction and the second horizontal direction; and a read head configured to be moved as one body with the first one of the first holder and the second holder, and configured to read the gradations of the scale member to measure a position of the first one of the first holder and the second holder, wherein the moving unit comprises:

a first moving unit configured to move the first one of the first holder and the second holder along the first horizontal direction; and a second moving unit configured to move the first one of the first holder and the second holder along the second horizontal direction, and wherein the first moving unit is fastened to a pair of rails extending in the first horizontal direction, and configured to be moved along the pair of rails, and two opposite ends of the first moving unit in the second horizontal direction are moved independently along the pair of rails, respectively.

2. The bonding apparatus of claim 1, wherein a stroke of the first moving unit along the first horizontal direction is smaller than a stroke of the second moving unit along the second horizontal direction.

3. The bonding apparatus of claim 1, wherein the read head includes multiple read heads, the second moving unit is disposed above the first moving unit, the first one of the first holder and the second holder is fastened to the second moving unit and moved as one body with the second moving unit, and the multiple read heads are fastened to a mounting member, which is provided at the second moving unit, at a distance therebetween in the second horizontal direction.

4. The bonding apparatus of claim 3, wherein the distance is equal to or less than a diameter of the second substrate.

5. The bonding apparatus of claim 1, wherein the read head includes multiple read heads, wherein the bonding apparatus further comprises:

a controller configured to control the first moving unit to adjust moving amounts of the two opposite ends such that measurement results of the multiple read heads regarding the first horizontal direction are identical.

6. The bonding apparatus of claim 1, wherein the scale member is disposed at a position closer to a substrate holding surface of the first one of the first holder and the second holder than to a bottom surface of the housing along a vertical direction.

7. The bonding apparatus of claim 1, wherein the scale member has a rectangular shape in which a length of a side along the first horizontal direction is shorter than a length of a side along the second horizontal direction, when viewed from a top.

8. The bonding apparatus of claim 1, wherein the moving unit comprises a rotating unit configured to rotate at least one of the first holder or the second holder around a vertical axis.

9. The bonding apparatus of claim 1, further comprising:

an elevating unit configured to bring the second one of the first holder and the second holder closer to the first one of the first holder and the second holder.

10. A bonding system, comprising:

a surface modifying apparatus configured to modify surfaces of a first substrate and a second substrate;

a surface hydrophilizing apparatus configured to hydrophilize the modified surfaces of the first substrate and the second substrate; and a bonding apparatus configured to bond the hydrophilized first substrate and the hydrophilized second substrate by an intermolecular force, wherein the bonding apparatus comprises:

a first holder configured to attract and hold the first substrate from above;

a second holder configured to attract and hold the second substrate from below;

a moving unit configured to move a first one of the first holder and the second holder with respect to a second one of the first holder and the second holder in a first horizontal direction and a second horizontal direction orthogonal to the first horizontal direction;

a housing accommodating therein the first holder, the second holder, and the moving unit;

a scale member, disposed within the housing, having gradations indicating positions in the first horizontal direction and the second horizontal direction; and a read head configured to be moved as one body with the first one of the first holder and the second holder, and configured to read the gradations of the scale member to measure a position of the first one of the first holder and the second holder, wherein the moving unit comprises;

a first moving unit configured to move the first one of the first holder and the second holder along the first horizontal direction; and a second moving unit configured to move the first one of the first holder and the second holder along the second horizontal direction, and wherein the first moving unit is fastened to a pair of rails extending in the first horizontal direction, and configured to be moved along the pair of rails, and two opposite ends of the first moving unit in the second horizontal direction are moved independently along the pair of rails, respectively.

11. A bonding method of bonding substrates to each other, comprising:

attracting and holding a first substrate with a first holder configured to attract and hold the first substrate from above;

attracting and holding a second substrate with a second holder configured to attract and hold the second substrate from below; and positioning the first holder and the second holder in a horizontal direction with a moving unit configured to move a first one of the first holder and the second holder with respect to a second one of the first holder and the second holder in a first horizontal direction and a second horizontal direction orthogonal to the first horizontal direction, wherein a scale member having gradations indicating positions in the first horizontal direction and the second horizontal direction, and a read head configured to be moved as one body with the first one of the first holder and the second holder and configured to read the gradations of the scale member to measure a position of the first one of the first holder and the second holder are disposed in a housing accommodating therein the first holder, the second holder, and the moving unit, and wherein the moving unit comprises:

a first moving unit configured to move the first one of the first holder and the second holder along the first horizontal direction; and a second moving unit configured to move the first one of the first holder and the second holder along the second horizontal direction, and wherein the first moving unit is fastened to a pair of rails extending in the first horizontal direction, and configured to be moved along the pair of rails, and two opposite ends of the first moving unit in the second horizontal direction are moved independently along the pair of rails, respectively in the positioning of the first holder and the second holder, the moving unit is moved based on a measurement result by the read head.

12. A computer-readable recording medium having stored thereon computer-executable instructions that, in response to execution, cause a bonding method as claimed in claim 11 to be performed.

* * * * *